United States Patent
Morris

[19]

[11] Patent Number: 5,808,480
[45] Date of Patent: Sep. 15, 1998

[54] HIGH VOLTAGE SWING OUTPUT BUFFER IN LOW VOLTAGE TECHNOLOGY

[75] Inventor: Bernard Lee Morris, Emmaus, Pa.

[73] Assignee: Lucent Technologies Inc., Murray Hill, N.J.

[21] Appl. No.: 607,954

[22] Filed: Feb. 29, 1996

[51] Int. Cl.[6] .................. H03K 19/0185; H03K 19/0948
[52] U.S. Cl. .............................................. 326/81; 326/83
[58] Field of Search .................................. 326/68, 80–81, 326/83, 63, 121, 86; 327/333, 544

[56] References Cited

U.S. PATENT DOCUMENTS

| | | | |
|---|---|---|---|
| 4,704,547 | 11/1987 | Kirsch ....................................... | 307/443 |
| 5,029,284 | 7/1991 | Feldbaumer et al. ..................... | 326/30 |
| 5,117,131 | 5/1992 | Ochi et al. ................................ | 326/81 |
| 5,300,832 | 4/1994 | Rogers ..................................... | 307/475 |
| 5,381,062 | 1/1995 | Morris ...................................... | 326/68 |
| 5,408,191 | 4/1995 | Han et al. ................................. | 327/543 |
| 5,483,176 | 1/1996 | Rodriguez et al. ....................... | 326/83 |

*Primary Examiner*—Jon Santamauro
*Attorney, Agent, or Firm*—James H. Fox

[57] ABSTRACT

An integrated circuit output buffer that is fabricated using a relatively low voltage technology is capable of driving a relatively high voltage swing to an output conductor. For example, a buffer implemented in 3.3 volt CMOS technology can deliver a 5 volt output swing. This is achieved by scaling up the output voltage swings from the lower voltage level to the higher voltage level using one or more intermediate inverters that operate at successively higher voltage levels. In a preferred embodiment, the voltage levels are provided using a power conservation circuit that limits current flow through a resistor voltage divider network.

12 Claims, 3 Drawing Sheets

HIGH VOLTAGE SWING OUTPUT BUFFER IN LOW VOLTAGE TECHNOLOGY

BACKGROUND OF THE INVENTION

1. Field of the Invention

The present invention relates to an integrated circuit output buffer.

2. Description of the Prior Art

Integrated circuit (IC) output buffers implemented in CMOS technology usually comprise a p-channel pull-up transistor and an n-channel pull-down transistor. These transistors are connected between the positive and negative power supply voltages $V_{DD}$ and $V_{SS}$, respectively. This arrangement provides an output voltage swing approximating these voltages, or in other words a 0 to 5 volt swing in the case that $V_{SS}$=0 volts and $V_{DD}$=5 volts. This is satisfactory when interfacing with other ICs that also operate over the same voltage swing as these power supply voltages. However, increasingly in integrated circuit technology, the need arises to interface with ICs that operate at different power supply voltages, and hence are adapted to utilize a different output (or input) voltage swing.

For example, the trend toward lower power supply voltages implies that devices fabricated in a lower voltage technology (e.g., 3 volts or less) may need to interface with devices fabricated in a higher voltage technology (e.g., 5 volt). A problem arises with ensuring reliability of the lower voltage devices, since the higher voltage level may be present on a bidirectional bus. For example, a 5 volt output signal may be placed on a bus from a device operating at 5 volts, and this voltage appears across the gate oxide (i.e., across the gate-to-source or gate-to-drain electrodes) of the n-channel pull-down transistor of a 3 volt output buffer also connected to the bus. (As used herein, "3 volt" includes the standard 3.3 volt ±10% power supply voltage). Since this gate oxide of a 3 volt device is typically thinner than that of a 5 volt device, degradation of the gate oxide may occur due to the high electric fields thereacross. The source-to-drain voltage in a 3 volt device is also typically limited to less than about 3.3 volts plus 10 percent, usually due to hot electron effects. In the prior art, this degradation is typically avoided by fabricating an output device in 5 volt technology, so that the gate oxides of the output (and input) buffers can withstand a 5 volt signal. Then, the logic "core" of the device that does not directly interface with the input/output busses is operated at a 3.3 volt level, so as to obtain reduced power consumption for example. However, this significantly limits the performance of the core logic, since the devices are not optimized for 3.3 volt operation. It is also known to use voltage-dropping transistors to protect pull-up and pull-down devices in an output buffer; see, for example, U.S. Pat. No. 5,381,062 co-assigned herewith.

SUMMARY OF THE INVENTION

I have invented an integrated circuit output buffer that is fabricated using a relatively low voltage technology and is capable of driving a relatively high voltage swing to an output conductor. For example, the inventive buffer implemented in 3.3 volt CMOS technology can deliver a 5 volt output swing. This is achieved by scaling up the output voltage swings from the lower voltage level to the higher voltage level using one or more intermediate inverters that operate at successively higher voltage levels. In a preferred embodiment, the voltage levels are provided using a power conservation circuit that limits current flow through a voltage divider network.

DETAILED DESCRIPTION

Figure 1:
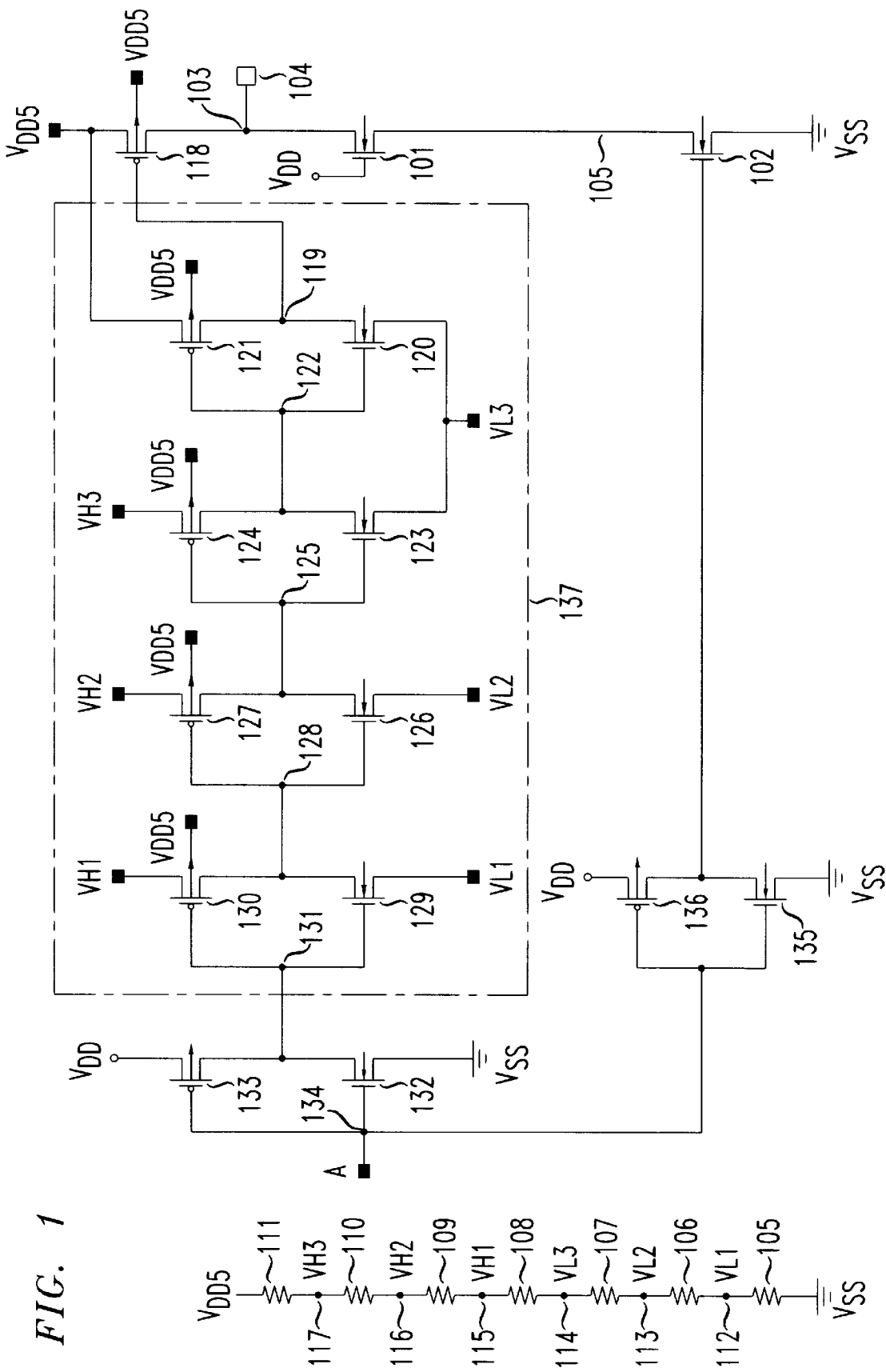
FIG. 1 shows a first embodiment of the invention using a resistor voltage-divider string.

The present invention relates to an integrated circuit output buffer that allows for providing an output voltage swing at a value greater than the voltage for which the transistors in the output buffer are designed to operate. The case of a 3.3 volt CMOS technology integrated circuit driving a 5 volt output swing will be illustrated herein, but with application to other voltage levels being possible. For example, 2.5 volt CMOS technology is also currently in use, with still lower voltages contemplated. An illustrative circuit that embodies the inventive technique is shown in FIG. 1. The pull-down side consists of two n-channel devices in series. Transistor 101, the transistor closest to the output node 103 connected to bondpad 104, has its gate permanently connected to $V_{DD}$, which has a nominal value of 3.3 volts. The second pull-down transistor, 102, has its gate switched between $V_{DD}$ and $V_{SS}$ (ground) by inverter transistors 135–136. Transistor 101 acts to protect the gate oxide of 102 from ever exceeding $V_{DD}$, since it does not allow node 105 to rise above the value of $V_{DD}-V_{thn}$ (the threshold of the n-channel transistor) even when 5 volts is applied to bondpad 104. This protection of the n-channel pull-down device is known in the art, as shown for example in U.S. Pat. No. 4,704,547 co-assigned herewith.

The inventive circuit further includes, in the illustrative embodiment, means for protecting the pull-up device 118. For this purpose, a resistor voltage divider network shown in FIG. 1 comprises resistors 105–111 in a series string. This string provides reference voltages VL1–VL3 and VH1–VH3 on nodes 112–117, respectively. These voltages scale with $V_{DD5}$, nominally 5 volts. The values of these voltages are shown in the Table below. Resistors 105–111 may be formed in a semiconductor diffusion region, such as an n-tub, or highly doped source/drain regions, for example. These materials typically have a breakdown voltage in excess of 5 volts, and so will not suffer damage from being connected to $V_{DD5}$. Other resistor materials, including doped polysilicon for example, are alternatively possible.

TABLE

Reference voltages from resistor divider

| Node | $V_x/V_{DD5}$ | Nominal $V_x$ |
|---|---|---|
| | | (volts @ $V_{DD5}$ = 5 V) |
| VL1 | 0.12 | 0.60 |
| VL2 | 0.23 | 1.15 |
| VL3 | 0.34 | 1.36 |
| VH1 | 0.66 | 3.30 |
| VH2 | 0.78 | 3.90 |
| VH3 | 0.89 | 4.45 |

The p-channel pull-up transistor 118 has its source connected to power supply $V_{DD5}$, equal to 5 volts. The "back-gate" of this transistor, being the n-tub in which it is formed in the illustrative case, is also connected to $V_{DD5}$, in order to prevent the parasitic diode from turning on. The gate of transistor 118 is connected to node 119. When node 119 is at $V_{DD5}$, transistor 118 is turned off. To turn on 118 while not exceeding the 3.3 volt limit on the gate oxide, node 119 is connected to VL3 (node 114) through transistor 120. The difference between VL3 and $V_{DD5}$ is equal to $\frac{2}{3} \times V_{DD5}$, being 3.3 volts. Thus the gate-to-substrate voltage across the gate oxide of 118 will not exceed 3.3 volts when 118 is turned on. Voltage VH3 is chosen to be approximately 0.5 volts less than $V_{DD5}$. This ensures that transistor 121 is turned off when node 122 is high, since this voltage is always less than the threshold voltage of transistor 121.

Likewise voltage VH2 is 0.55 volts less than VH3, and VH1 is 0.6 volts less than VH2, thereby ensuring that transistors 124 and 127 are turned off when their respective input nodes (125, 128) are high. Since VH1=$\frac{2}{3} \times V_{DD5}$, it is equal to 3.3 volts, so that node 131 can be taken down to ground (0 volts), thereby turning off transistor 129 without exceeding the gate voltage limit of transistor 130. In a similar manner VL2 is chosen to be 0.55 volts less than VL3, and VL1 is 0.6 volts less than VL2, thereby allowing the input nodes of transistors 123, 126 and 129 (i.e., nodes 125, 128, 131) to go high without exceeding 3.3 volts across their respective gate oxides. This provides "voltage tapering" of the power supply voltages on the intermediate inverters, shown collectively as block 137. The voltage tapering is the method by which the input signal A, which goes from ground to $V_{DD}$ (3.3 volts) at the input node 134 of inverter 132–133, can cause the output at node 103 to go from ground to $V_{DD5}$ (5 volts), without ever exceeding $V_{DD}$ volts across a gate oxide. Note that the inverter transistors 135–136 serve to invert the buffer input signal on node 134, in order to drive the pull-down transistor 102 with the correct phase.

Although the basic circuit of FIG. 1 will do the job of providing a 5 volt output in a 3.3 volt technology, it may be optionally improved in several ways. The resistor divider tree, (105–111), draws direct current (DC) power all of the time. The values of the resistors should not be made too large, in order to allow the switching displacement current generated by transistors in the intermediate inverters 137 to be sourced/sunk without unduly changing the values of the reference voltages VL1–3 and VH1–3. Clearly, the lower the value of resistors the better they will keep these voltages at constant values, but unfortunately this will also cause larger DC power. It is desirable to have a power-down mode where the current in the resistor tree, typically 0.5 mA, is reduced to a few micro-amps. This can be accomplished with the circuit shown in FIG. 2. In normal operation, LP=0, so node 201 is low. Therefore, node 204 (connected to node 204') is high, due to inverter transistors 202–203, node 207 is low due to 205–206, node 210 is high due to 208–209, node 213 (connected to node 213') is low due to 211–212, and node 216 (connected to node 216') is high due to 214–215. Hence, transistors 217 and 218 are on, with on-resistances which are much less than those of any of the resistors 219–225, and transistor 226 is off. In this case VL1–3 and VH1–3 have the values shown in Table I, and DC power is consumed. Note the addition of capacitances 238 and 239 on nodes 234 and 235, respectively. These capacitances help to stabilize the voltages on these nodes (VL3 and VH1, respectively) during switching.

In order to turn transistor 217 on and off without violating the 3.3 volt limit on its gate oxide, additional circuitry is provided. This includes transistors 227–229, which are small transistors hooked up as diodes. They provide reference voltages $V_{33X}$ and $V_{66X}$ on nodes 230 and 231 respectively, being $\frac{1}{3}$ and $\frac{2}{3}$ of $V_{DD5}$ respectively, to the inverter chain made from 202–203, 205–206, 208–209, 211–212 and 214–215. The use of transistors 227–229 rather than another resistor divider tree is advantageous for obtaining reduced integrated circuit area, since obtaining a very high impedance requires a very large area with resistors. The inverter chain formed by transistors 208–209, 211–212 and 214–215 serves as an intermediate inverter chain that operates in a similar manner to that of the intermediate inverter chain 137 shown in FIG. 1. This design ensures that no gate oxide exceeds the 3.3 volt limit. In the low power mode signal LP=1 (node 201 high), and transistors 217 and 218 are off. Transistor 226 is now on, and pulls nodes 232–234 (VL1–3) and nodes 235–237 (VH1–3) up to $V_{DD}$, being 3.3 volts nominal. The only DC power now consumed is in transistors 227–229. With small transistor sizes (e.g., gate length 2.0 micrometers and gate width 4.0 micrometers), the DC current is 19 microamps nominal.

Figure 2:
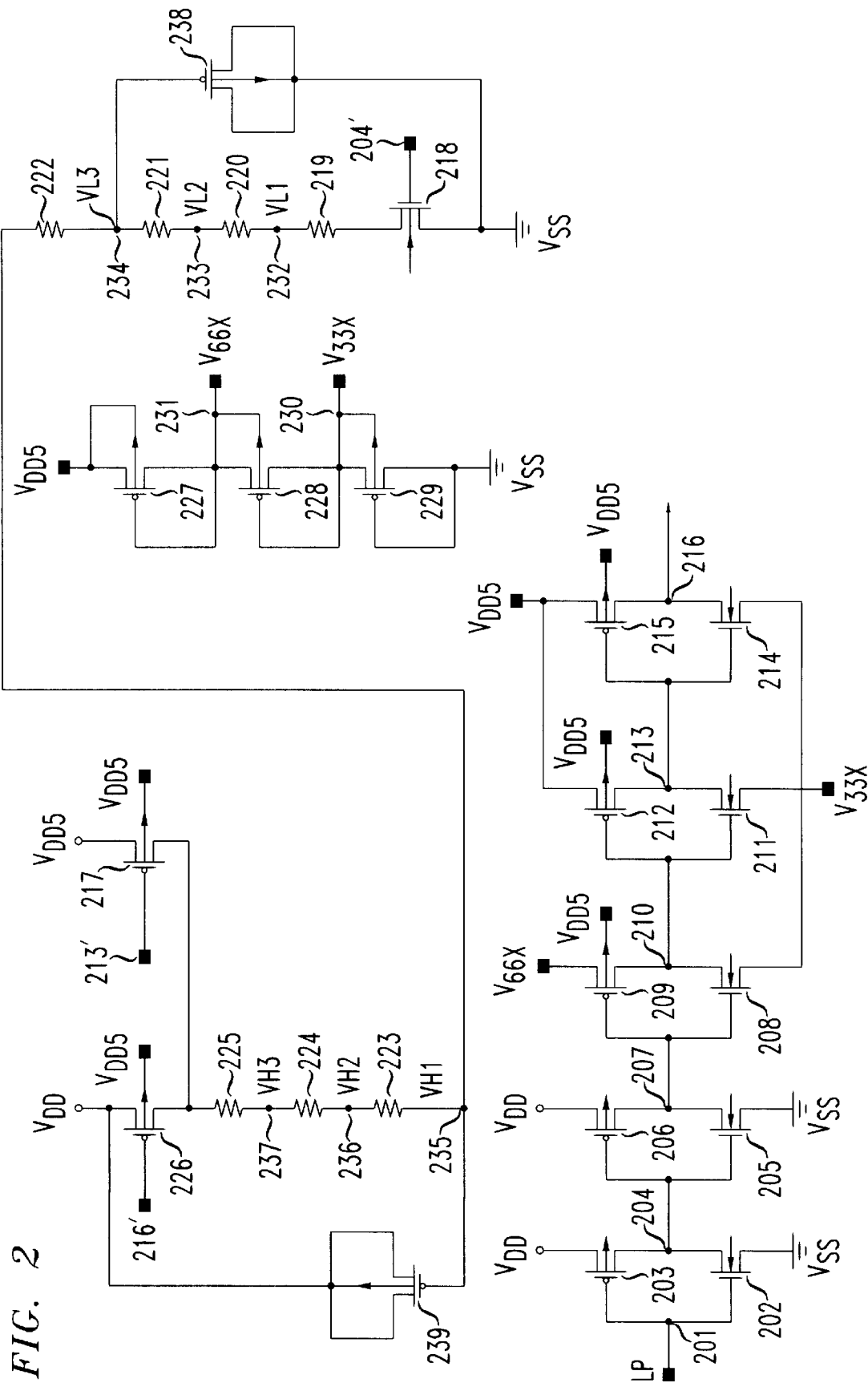
FIG. 2 shows a second embodiment of the invention using a reduced-current voltage-divider string.
Figure 3:
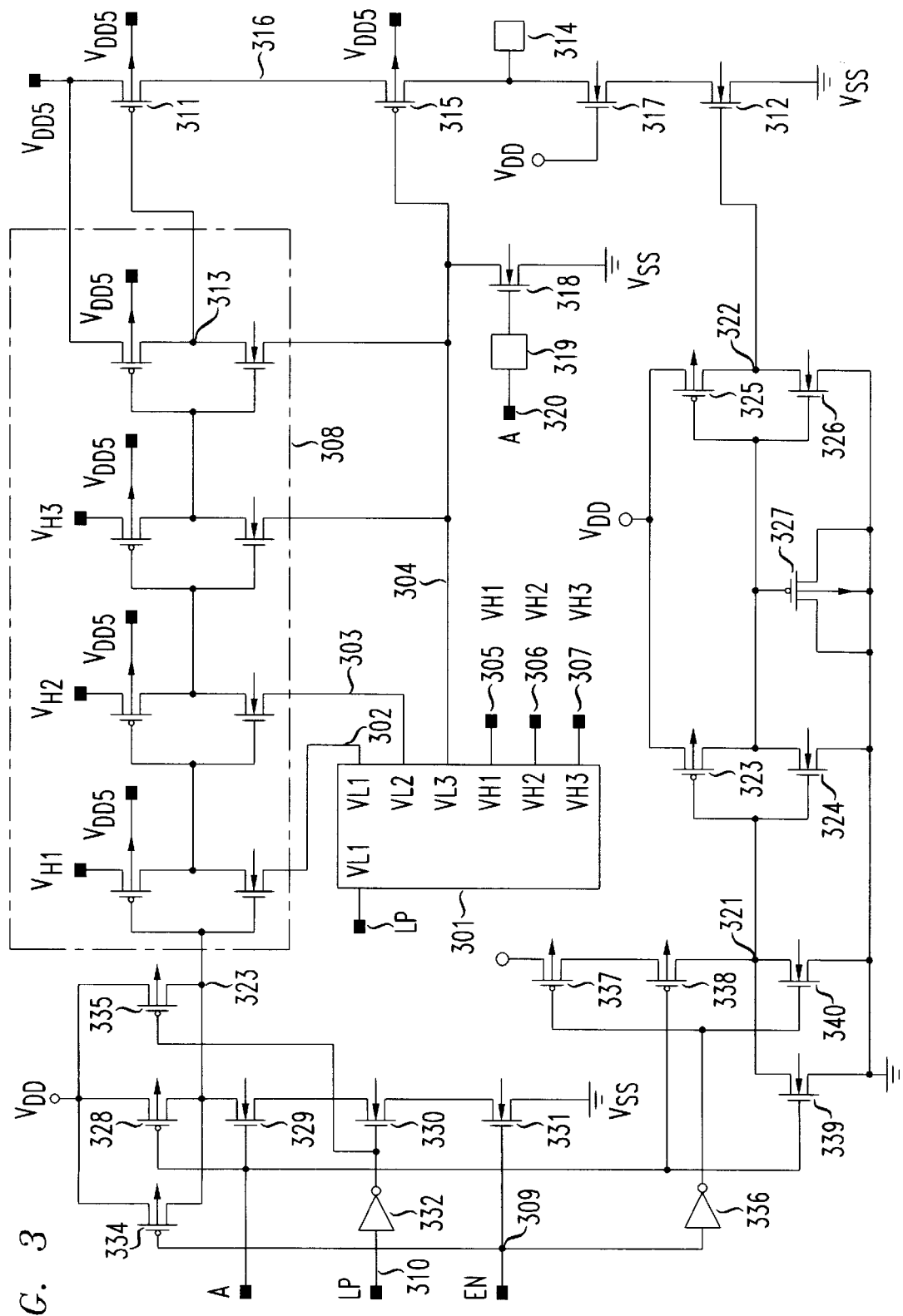
FIG. 3 shows a third embodiment of the invention using a preferred reduced-current voltage-divider string.

A few further optional enhancements are shown in FIG. 3, which allow the output buffer to be used as a bidirectional buffer which includes a 5 volt tolerant input stage (not shown). The voltage divider network shown in FIG. 2 is shown as block 301 in FIG. 3, which produces voltages VL1–3 and VH1–3 on nodes 302–307, respectively. The intermediate inverters are shown in block 308. In the embodiment of FIG. 3, a tri-state mode is added. The tri-state enable signal EN on line 309 is ANDed with the low power input signal LP on line 310. In the high impedance state ("tri-state"), output transistors 311 and 312 are off. Since node 313 is now at $V_{DD5}$, there is a potential problem of forcing 5 volts across the gate of transistor 311 if an input voltage of zero volts is placed on the bondpad 314. To avoid this problem, transistor 315 is added, the gate of which is tied to node 304 (VL3), having a voltage of $\frac{1}{3}$ $V_{DD5}$. Therefore, transistor 315 acts to protect 311 by not allowing node 316 to go more than a gate-to-source threshold ($V_{GS}$) above (i.e., more positive than) node 304 (VL3). This operation is similar to how transistor 317 protects 312 when a 5 volt signal is applied to the bondpad 314 from an external source when the output buffer is in the tri-state condition. Hence, the output buffer allows the bondpad 314 to be used as an input bondpad to an appropriate input buffer (not shown) when the output buffer is in the tri-state condition.

With reference again to FIG. 2, it has also been found that although the capacitor 238 tied to the resistor divider node 234 does stabilize VL3, the relatively large displacement current dumped into this node each time that transistor 120 (FIG. 1) is turned on causes the node 234 to equilibrate at a value appreciably above its DC value. This slows down the output buffer, by reducing the drive available from transistors 120 and 123 (FIG. 1). As shown in FIG. 3, the addition of transistor 318 and a simple one-shot multivibrator 319 remedies this problem. Whenever the input signal A on node 320 goes high, the one-shot multivibrator turns on transistor 318 for about 1 nanosecond, partially discharging node 304 to ground. This aids the resistor divider tree 301 to maintain VL3 near to its DC value, without adding DC power.

A final optional enhancement is the addition of a delay stage between nodes 321 and 322. This is desirable because the four intermediate inverters (308) cause a delay between nodes 323 and 313. The delay stage formed by transistors 323–327 matches this delay, and thus helps to prevent overlap current that would be caused by both 311 and 312 being both on at the same time.

Note that in the illustrative embodiment, four intermediate voltage step-up inverters (in block 308) are used between the buffer input inverter (328, 329) and the buffer output inverter (311, 312) of the output buffer. However, any number (i.e., one or more) intermediate voltage step-up inverters may be used. Various current-limiting techniques other than those shown in the illustrative embodiment may be used to reduce DC current consumption when resistor voltage dividers are used, according to techniques known in the art. Furthermore, other techniques for generating the voltages applied to the intermediate inverters may be used. For example, voltage dividers formed of capacitors may be used. In fact, the intermediate voltages may be obtained from voltage boosting circuits that draw power from the low-voltage power supply, if desired. While the pull-up transistor is protected by the use of the intermediate inverters in the above embodiment, the pull-down transistor may be similarly protected. That is, the intermediate inverters may operate with power supply voltages that decrease from the high (most positive) to the low (most negative) level as the buffer input signal traverses from the input of the buffer toward the output. Application of the inventive technique to allow a given IC to drive higher voltages, for example 15 volts for EEPROM programming or liquid crystal displays, is of course possible.

While the output buffer is shown implemented in CMOS technology, other types are possible. For example, it is known in the art to use n-channel transistors as both the pull-up and pull-down devices. Use of the inventive technique with bipolar devices is also readily possible. Still other variations that implement the inventive teaching are possible.

I claim:

1. An integrated circuit comprising an output buffer implemented in a relatively low voltage technology and adapted to deliver a relatively high voltage output swing, characterized in that said output buffer comprises a buffer input inverter operating at a low power supply voltage and having an output, a buffer output inverter operating at a high power supply voltage and having an input, and at least one intermediate inverter having an input coupled to the output of said buffer input inverter and having an output coupled to the input of said buffer output inverter and operating at an intermediate power supply voltage greater that said low power supply voltage but less than said high power supply voltage, wherein said intermediate voltage is obtained from a voltage divider network connected to said high power supply voltage, with said voltage divider network comprising a series string of voltage divider resistors, and wherein said voltage divider network further comprises at least one switching device for reducing the current flowing through said resistor string during a lower power mode.

2. The integrated circuit of claim 1 wherein said buffer input inverter, said buffer output inverter, and said at least one intermediate inverter each comprise a p-channel pull-up transistor and an n-channel pull-down transistor.

3. The integrated circuit of claim 1 wherein said low voltage technology is limited to a said low voltage by at least one factor selected from the group consisting of: gate-to-source breakdown voltage, gate-to-drain breakdown voltage, and source-to-drain voltage limit.

4. The integrated circuit of claim 1 wherein said low voltage technology is nominally 3.3 volts or less.

5. An integrated circuit comprising an output buffer having transistors with gate, source, and drain electrodes implemented in a given technology, with said output buffer adapted to deliver an output signal at a voltage greater than that which would cause degradation in the reliability of said transistors if said voltage were applied across two of said electrodes of any one of said transistors, characterized in that said output buffer comprises an input inverter having an output coupled to an input of a first intermediate inverter having an output coupled to an input of an output inverter, and wherein said input inverter operates at a low power supply voltage, said output inverter operates at a high power supply voltage, and said first intermediate inverter operates at a first intermediate power supply voltage greater than said low power supply voltage but less than said high power supply voltage.

6. The integrated circuit of claim 5 further comprising at least one additional intermediate inverter having an input coupled to the output of said first intermediate inverter, an output coupled to the input of said output inverter, and operating at a second intermediate power supply voltage greater than said first intermediate power supply voltage but less than said high power supply voltage.

7. The integrated circuit of claim 5 wherein said first intermediate voltage is obtained from voltage divider network connected to said high power supply voltage.

8. The integrated circuit of claim 7 wherein said voltage divider network comprises a series string of voltage divider resistors.

9. The integrated circuit of claim 8 wherein said voltage divider network further comprises at least one switching device for reducing the current flowing through said resistor string during a low power mode.

10. The integrated circuit of claim 5 wherein said buffer input inverter, said buffer output inverter, and said at least one intermediate inverter each comprise a p-channel pull-up transistor and an n-channel pull-down transistor.

11. The integrated circuit of claim 5 wherein said low voltage technology is limited to a said low voltage by at least one factor selected from the group consisting of: gate-to-source breakdown voltage, gate-to-drain breakdown voltage, and source-to-drain voltage limit.

12. The integrated circuit of claim 5 wherein said low voltage technology is nominally 3.3 volts or less.

* * * * *